United States Patent [19]

Smith

[11] 4,383,248

[45] May 10, 1983

[54] LATCHABLE FAST SETTLING DIGITAL TO ANALOG CONVERTER BIT SWITCH

[75] Inventor: Gregory J. Smith, Chandler, Ariz.

[73] Assignee: Motorola, Inc., Schaumburg, Ill.

[21] Appl. No.: 332,405

[22] Filed: Dec. 21, 1981

[51] Int. Cl.³ .............................................. H03K 13/02
[52] U.S. Cl. .............................................. 340/347 DA
[58] Field of Search ............... 340/347 DA; 307/362, 307/252

[56] References Cited

U.S. PATENT DOCUMENTS 3,961,326 6/1976 Craven ........................ 340/347 DA
4,295,063 10/1981 Price .................................... 307/362
4,323,795 4/1982 Holloway ..................... 340/347 DA

OTHER PUBLICATIONS

Dooley "IEEE Journal of Solid–State Circuits", vol. SC-8, No. 6, Dec. 1973, pp. 404–407.

Brokaw "IEEE Journal of Solid–State Circuits", vol. SC-13, No. 6, Dec. 1978, pp. 736–745.

*Primary Examiner*—C. D. Miller
*Attorney, Agent, or Firm*—William E. Koch

[57] ABSTRACT

A latchable bit switch for use in a digital-to-analog converter comprising four differential pairs of transistors and a capacitor. The first pair are responsive to a digital input signal and an inverse digital input signal while the second pair are cross coupled and are responsive to the output of the first pair. The third pair are responsive to a toggle signal and a latch signal and enable either the first or second pair. The fourth pair are responsive to the output of the first and second pair and enable a bit current to a summing bus. The capacitor is coupled across the output of the first and second pair thereby reducing glitches in the bit current caused by the charging of junction capacitances by the fast transitions of the digital input, toggle, and latch signals.

7 Claims, 1 Drawing Figure

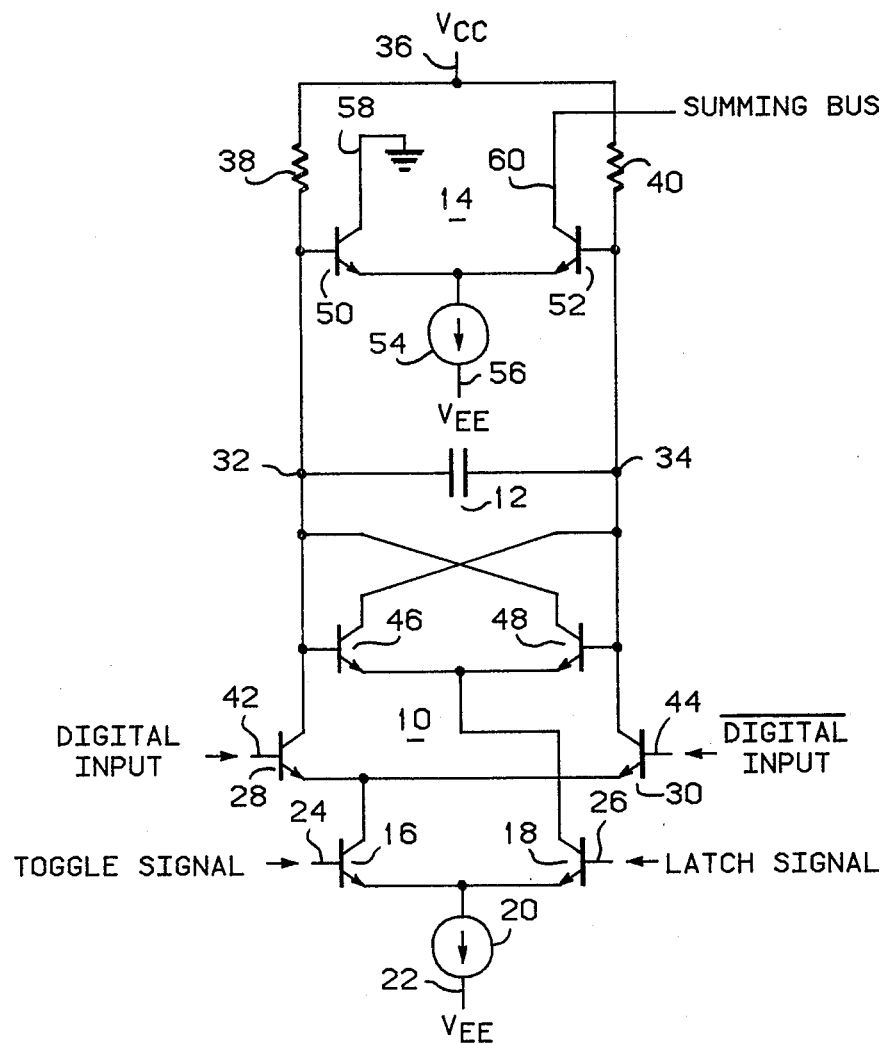

LATCHABLE FAST SETTLING DIGITAL TO ANALOG CONVERTER BIT SWITCH

BACKGROUND OF THE INVENTION

1. Field of the Invention

This invention relates to digital-to-analog converters, and more particularly to an integrated latchable bit current switch circuit having a capacitance reduced settling time.

2. Prior Art

Digital-to-analog converters typically have a plurality of differential transistor pairs functioning as switches. Digital input signals representative of a binary number determine the on-off state of each switch wherein the on state of each switch supplies a binary scaled bit current to a summing bus to form an analog signal corresponding to the digital input signal.

One such type of switch, the Craven cell, is described in U.S. Pat. No. 3,961,326. The Craven cell comprises a first differential transistor pair which are biased by an input signal and a reference voltage, and a second differential pair which switch the bit current between the output bus and ground. However, in the Craven cell, a rapid change in the input level is coupled through the base-collector capacitance of the input transistor of the first differential pair and affects the voltage at the base of one of the transistors in the second differential pair. Thus, the voltages at the bases of the second differential pair are not precisely differential voltages. This causes a glitch at the emitters of the second differential pair which, especially in the case of low bit currents, may take a considerable amount of time to settle out.

Another known switch that substantially eliminates the glitches inherent in the Craven cell is described in U.S. Pat. No. 4,295,063, wherein a first differential transistor pair is biased by a digital input signal and a reference voltage, a second differential transistor pair directs a bit current onto a summing bus, and a third differential transistor pair has an input coupled to the first pair and an output coupled to the second pair for reducing any overshoot in the magnitude of the output caused by fast transitions of the input signals.

Another known switch, wherein the output may be latched, comprises a first differential transistor pair biased by a digital input signal and a reference voltage, a second differential transistor pair that are cross-coupled and are responsive to the output of the first pair, a third differential transistor pair responsive to the output of the first and second pair for directing an output current onto a summing bus, and a fourth differential transistor pair responsive to toggle and latch signals for enabling either the first or second pair. However, parasitic feedback caused by the junction capacitance in the third and fourth pair due to the fast transitions of the digital input signal and toggle and latch signals creates an overshooting or glitches in the output signal on the summing bus.

Thus, what is needed is a latchable bit switch that reduces parasitic feedback or glitches in the output caused by the junction capacitance of switching devices, thereby reducing the settling time or ringing of output.

SUMMARY OF THE INVENTION

Accordingly, it is an object of the present invention to provide an improved latchable bit switch for a digital-to-analog converter.

A further object of this invention is to provide a latchable bit switch for a digital-to-analog converter that reduces parasitic feedback caused by the junction capacitance of switching devices.

Yet another object of this invention is to provide a latchable bit switch for a digital-to-analog converter that reduces parasitic feedback caused by the junction capacitance of switching devices by a simple but effective means that requires a relative small silicon area when the entire circuit is integrated on a single chip.

In carrying out the above and other objects of the invention in one form, there is provided an improved latchable bit switch for use in a digital-to-analog converter for enabling a bit current generated by a bit current source to a summing bus. A capacitor is coupled across the output of a data input differential pair of switching devices and a cross coupled differential pair of switching devices for reducing glitches from the bit current. The data input differential pair of switching devices is responsive to a digital input signal having first and second states and an inverse digital input signal or a reference voltage. The cross coupled differential pair of switching devices is responsive to the output of the data input differential pair of switching devices and a means is provided for enabling a latch current generated by a latch current source to the data input differential pair of switching devices when a toggle signal is received and to the cross coupled differential pair of switching devices when a latch signal is received. A digital-to-analog differential pair of switching devices is responsive to the output of the data input differential pair of switching devices and the cross coupled differential pair of switching devices and enables the bit current when the digital input signal is in the first state and the toggle signal is received by the means, the bit current being latched as long as the latch current is being received.

The above and other objects, features, and advantages of the present invention will be better understood from the following detailed description taken in conjunction with the accompanying drawings.

BRIEF DESCRIPTION OF THE DRAWING

The single FIGURE is a schematic of the preferred embodiment of the invention.

DETAILED DESCRIPTION OF THE INVENTION

A digital-to-analog converter typically comprises a plurality of bit switches, each switch receiving a digital input signal wherein the signals are representative of a binary number. The output of each bit switch is summed to give an analog signal. Referring to the single FIGURE, a digital-to-analog bit switch in accordance with this invention comprises output latch 10, capacitor 12, and digital-to-analog converter output switch 14. The switch is shown as a portion of a digital-to-analog converter integrated circuit, but may also be constructed with discrete elements. Output latch 10 includes a mode control differential pair comprising emitter coupled NPN transistors 16 and 18. A latch current source 20 is coupled between a voltage $V_{EE}$ via first $V_{EE}$ conductor 22 and the emitter of transistors 16 and 18. The bases of transistors 16 and 18 are connected to toggle signal conductor 24 and latch signal conductor 26, respectively. Since the toggle signal and latch signal are complementary, only one of transistors 16 and 18 will be conducting current from the remainder of latch circuit 10 at a given time.

The collector of transistor 16 is connected to the coupled emitters of data input differential pair transistors 28 and 30. The collectors of transistors 28 and 30 are connected to nodes 32 and 34, respectively, and nodes 32 and 34 are coupled to $V_{CC}$ conductor 36 by resistors 38 and 40 respectively. Digital input conductor 42 and inverse digital input conductor 44 are connected to the bases of transistors 28 and 30, respectively, whereby the digital input signal relative to the inverse digital input signal determines the voltage at nodes 32 and 34 when a toggle switch is being received by transistor 16. The inverse digital input may alternatively be a threshold voltage.

The collector of transistor 18 is connected to the coupled emitters of cross coupled differential pair transistors 46 and 48. The base and collector of transistor 46 are connected to nodes 32 and 34, respectively, while the base and collector of transistor 48 are connected to nodes 34 and 32, respectively.

The digital-to-analog converter output switch 14 comprises a digital-to-analog converter output differential pair including coupled emitter NPN transistors 50 and 52. Bit current source 54 is coupled between second $V_{EE}$ conductor 56 and the emitters of transistors 50 and 52. The bases of transistors 50 and 52 are connected to nodes 32 and 34 respectively, and the collectors of transistors 50 and 52 are connected to ground conductor 58 and summing bus 60 respectively. Ground conductor 58 may alternatively be an inverse summing bus.

In operation, a bias voltage $V_{CC}$ is applied at conductor 36 which provides a voltage potential at nodes 32 and 34. A toggle signal at the base of transistor 16 causes transistor 16 to conduct current from node 32 when a "high" digital input turns on transistor 28. This pulls the voltage at node 32 down thereby turning off transistor 50. Since transistor 30 is off, node 34 is "high", turning on transistor 52 and enabling the current path to summing bus 60.

When a low digital input turns off transistor 28, transistor 30 turns on, lowering the voltage at node 34 and increasing the voltage at node 32. Transistor 50 is therefore on, diverting the bit current to ground.

A latch signal at the base of transistor 18, turns transistor 18 on enabling a current path from node 32 or 34 depending on which node had current flowing through it when the latch signal was received. For example, if the current path comprised resistor 38, transistor 28 and transistor 16 when the latch signal was received, node 34 was high. Therefore, transistor 48 is biased on, diverting the current along the path comprising resistor 38, transistor 48 and transistor 18.

During the transistion from a toggle signal high state to a latch signal high state, the latch current is redirected to the same conducting load resistor 38 or 40 through the cross coupled transistor pair 46 and 48. The digital information at node 32 and 34 is maintained until the toggle signal again is high. During the transition to the latch state, the magnitude of the current in the load resistors 38 and 40 varies as the latch current source 20 must charge and discharge the time variant base-emitter capacitances of transistors 16 and 18, respectively. This variation in load current translates to an undesired analog signal that normally would be coupled through transistors 50 and 52. In order to prevent this undesired analog signal, capacitor 12 is coupled between nodes 32 and 34 for reducing parasitic coupled high frequency variations at the summing bus. The effect of voltage gain from the digital input multiplies the effect of the actual capacitor's value. The RC value of the resulting capacitance and load impedance (resistors 38 and 40) dampen the response of the latch output. Data transistions are slower and better behaved and glitches during the latching of previous data are attenuated. The proper RC value will actually improve the bit switches settling time by reducing the overshoot at the transistor bases, a major cause of overshoot and ringing at the digital-to-analog converter output. The use of capacitor 12 results in an improved latch and yet does not require much silicon area when the entire circuit is integrated on a single chip.

I claim:

1. A latchable bit switch for use in a digital-to-analog converter for enabling a bit current generated by a bit current source to a summing bus, comprising:

a data input differential pair of switching devices responsive to a digital input signal and an inverse digital input signal, said digital input signal having first and second states;

a cross coupled differential pair of switching devices responsive to the output of said data input differential pair of switching devices;

means for enabling a latch current generated by a latch current source to said data input differential pair of switching devices when receiving a toggle signal and to said cross coupled differential pair of switching devices when receiving a latch signal;

a digital-to-analog differential pair of switching devices responsive to the output of said data input differential pair of switching devices and said cross coupled differential pair of switching devices for enabling said bit current when said digital input signal is in said first state and said toggle signal is being received by said means, said bit current being latched as long as said latch signal is being received; and a capacitor coupled across the output of said data input differential pair of switching devices and said cross coupled differential pair of switching devices for reducing glitches from said bit current.

2. A latchable bit switch according to claim 1 wherein said data input differential pair of switching devices comprises first and second emitter coupled transistors, said first transistor having a base coupled to said digital input signal, a collector coupled to said cross coupled differential pair of switching devices and said digital-to-analog differential pair of switching devices, and an emitter coupled to said means, said second transistor having a base coupled to said inverse digital input signal, a collector coupled to said cross coupled differential pair of switching devices and said digital-to-analog differential pair of switching devices, and an emitter coupled to said means.

3. A latchable bit switch according to claim 2 wherein said cross coupled differential pair of switching devices comprises third and fourth emitter coupled transistors, said third transistor having a base coupled to the collector of said first transistor, a collector coupled to said digital-to-analog converter differential pair of switching devices, and an emitter coupled to said means, said fourth transistor having a base coupled to the collector of said second transistor, a collector coupled to said digital-to-analog differential pair of switching devices, and an emitter coupled to said means.

4. A latchable bit switch according to claim 3 wherein said digital-to-analog differential pair of switching devices comprises fifth and sixth emitter coupled transistors, said fifth transistor having a base coupled to the collector of said first transistor, the base of said third transistor, and the collector of said fourth transistor, a collector coupled to ground, and an emitter coupled to said bit current source, said sixth transistor having a base coupled to the collector of said second transistor, the base of said fourth transistor, and the collector of said third transistor, a collector coupled to said summing bus, and an emitter coupled to said bit current source.

5. A latchable bit switch according to claim 4 wherein said means comprises seventh and eighth emitter coupled transistors, said seventh transistor having a base responsive to said toggle signal, a collector coupled to the emitters of said first and second transistors, and an emitter coupled to said latch current source, said eighth transistor having a base responsive to said latch signal, a collector coupled to the emitters of said third and fourth transistors, and an emitter coupled to said latch current source.

6. A latchable bit switch according to claim 5 wherein all of said transistors are NPN transistors.

7. An improved latchable bit switch for use in a digital-to-analog converter for enabling a bit current generated by a bit circuit source to a summing bus, having a data input differential pair of switching devices responsive to a digital input signal and an inverse digital input signal, said digital input signal having first and second states; a cross coupled differential pair of switching devices responsive to the output of said data input differential pair of switching devices; means for enabling a latch current generated by a latch current source to said data input differential pair of switching devices when receiving a toggle signal and to said cross coupled differential pair of switching devices when receiving a latch signal; a digital-to-analog differential pair of switching devices responsive to the output of said data input differential pair of switching devices and said cross coupled differential pair of switching devices for enabling said bit current when said digital input signal is in said first state and said toggle signal is being received by said means, said bit current being latched as long as said latch signal is being received; wherein the improvement comprises a capacitor coupled across the output of said data input differential pair of switching devices and said cross coupled differential pair of switching devices for reducing glitches from said bit current.

* * * * *